(12) United States Patent
Smith et al.

(10) Patent No.: US 7,141,993 B2
(45) Date of Patent: Nov. 28, 2006

(54) INTERFACE APPARATUS FOR INTEGRATED CIRCUIT TESTING

(75) Inventors: Douglas W. Smith, Los Altos, CA (US); Thornton W. Sargent, IV, Sutter Creek, CA (US); Stuart F. Daniels, Moorestown, NJ (US)

(73) Assignee: inTEST Corporation, Wilmington, DE (US)

( * ) Notice: Subject to any disclaimer, the term of this patent is extended or adjusted under 35 U.S.C. 154(b) by 0 days.

(21) Appl. No.: 10/468,277

(22) PCT Filed: Jul. 2, 2002

(86) PCT No.: PCT/US02/20891

§ 371 (c)(1),
(2), (4) Date: Dec. 17, 2003

(87) PCT Pub. No.: WO03/007002

PCT Pub. Date: Jan. 23, 2003

(65) Prior Publication Data

US 2004/0150490 A1 Aug. 5, 2004

Related U.S. Application Data

(63) Continuation of application No. 09/901,855, filed on Jul. 9, 2001, now abandoned.

(51) Int. Cl.
*G01R 31/02* (2006.01)
(52) U.S. Cl. .................................... 324/754
(58) Field of Classification Search ............ 324/765, 324/754, 758, 158.1, 72.5, 760, 761; 333/1, 333/238, 246; 439/189, 638, 761, 425–579
See application file for complete search history.

(56) References Cited

U.S. PATENT DOCUMENTS

| | | | | |
|---|---|---|---|---|
| 4,931,726 A | * | 6/1990 | Kasukabe et al. ........... 324/754 |
| 5,384,555 A | * | 1/1995 | Wilson et al. ................ 333/1 |
| 5,525,911 A | * | 6/1996 | Marumo et al. ............ 324/754 |
| 5,534,787 A | | 7/1996 | Levy |
| 5,912,597 A | * | 6/1999 | Inagawa et al. ............... 333/1 |
| 6,111,205 A | * | 8/2000 | Leddige et al. ............. 174/260 |
| 6,130,585 A | * | 10/2000 | Whybrew et al. ............. 333/1 |
| 6,133,805 A | * | 10/2000 | Jain et al. ....................... 333/1 |

(Continued)

FOREIGN PATENT DOCUMENTS

EP 0 977 045 A 2/2000

OTHER PUBLICATIONS

International Search Report for PCT Application No. PCT/US02/20891 mailed Feb. 11, 2003.

*Primary Examiner*—Jermele Hollington
*Assistant Examiner*—Tung X. Nguyen
(74) *Attorney, Agent, or Firm*—RatnerPrestia

(57) ABSTRACT

An apparatus and method for coupling a test head and probe card in an IC testing system incorporating patterned divider elements (24) disposed between rows of signal conductors (22) to provide matching characteristic impedance values along each row of signal conductors. The divider elements have a patterned conductive layer formed thereon that is electrically connected to ground, and a method for determining a useful pattern is provided. Test dividers (24) fabricated with openings of various size and shape are used to construct transmission lines. The impedance of these lines is measured, and the results are used to interpolate an appropriate opening size and shape to achieve a desired transmission line impedance.

13 Claims, 11 Drawing Sheets

U.S. PATENT DOCUMENTS 6,160,412 A    12/2000  Martel et al.
6,259,260 B1 *  7/2001  Smith et al. ................ 324/754
6,420,888 B1 *  7/2002  Griffin et al. ............... 324/754

* cited by examiner

INTERFACE APPARATUS FOR INTEGRATED CIRCUIT TESTING

RELATED APPLICATION DATA

The present application is a 371 of PCT/US02/20891 filed on Jul. 02, 2002, which is a continuation of U.S. Ser. No. 09/901,855 filed on Jul. 02, 2001 now abandoned.

FIELD OF THE INVENTION

The present invention relates to integrated circuit (IC) testing systems, and more particularly, to devices for coupling a test head with a probe card or dut board in an IC testing system.

BACKGROUND OF THE INVENTION

Wafer testing systems typically include a test head and a probe card. Packaged part testing systems typically include a test head and a dut board. The probe card or dut board includes a pattern of contacts for electrically probing or connecting to portions of an integrated circuit. The test head is configured to drive various contacts of the probe card or dut board to carry out particular test procedures within the integrated circuit. In the course of a test procedure, the test head receives output signals from the integrated circuit via the contacts of the probe card or dut board. The output signals are indicative of electrical characteristics of the integrated circuit under test. The probe card or dut board and the test head are uniquely configured for a particular integrated circuit and, in some cases, a particular test procedure. Accordingly, the probe card or dut board and/or the test head must be changed for different integrated circuits and test procedures.

The test head is electrically coupled to the probe card or dut board with a coupling apparatus (i.e., interface apparatus) often referred to as a "pogo" unit. The pogo unit engages the test head, or some intermediate coupling structure associated with the test head, and the probe card or dut board. The pogo unit includes an array of spring-loaded contacts referred to as pogo pins. The pogo pins act as signal and ground conductors, and are arranged to electrically couple contacts on the probe card or dut board to corresponding contacts on the test head. The spring force of the pogo pins helps to maintain uniformity of electrical contact between the various contacts of the probe card or dut board and the test head. When the test head and probe card or dut board are engaged with the pogo unit exerting pressure against the pogo pins, the pogo pins respond with a spring force that enhances coupling pressure. The resilience of the pins generally ensures adequate coupling pressure despite planar deformation of the test head or the probe card or dut board during a test procedure.

In many applications, the conductors are required to carry signals having very high frequency components, from 100's of MHz to 10 GHz in the near future and to 10's of GHz in the more distant future. Accordingly, the transmission line characteristic impedance, Z, of the signal path between the probe card or dut board and the test head is of prime interest. For optimal signal transfer between the test electronics and the device being tested, the characteristic impedance of all elements in the signal path should be closely matched. Usually, it is desired that all signal paths have the same impedance, for example 28, 50, or 75 Ohms, though it may be required that several different values of characteristic impedance be provided in the same interface.

SUMMARY OF THE INVENTION

An interface apparatus is used for integrated circuit testing. The apparatus includes a first plate having first locations, a second plate having second locations, conductors extending between the first locations on the first plate and the second locations on the second plate, and a conductive divider element spanning across ones of the conductors. The conductive divider element has a pattern of conductive material formed thereon.

DETAILED DESCRIPTION OF THE INVENTION

The present invention is directed to a device for coupling a test head with a probe card or dut board in an IC testing system using multiple signal conductors and ground conductors that provides improved characteristic impedance matching between the signal conductors. In one embodiment, the present invention is an improvement upon the invention of commonly assigned U.S. Pat. No. 6,259,260, which is incorporated herein by reference. Divider elements having a conductive layer thereon and disposed between rows of signal conductors, as taught in U.S. Pat. No. 6,259,260, are modified to provide matching characteristic impedance values for the signal conductors within a row. The characteristic impedance of the conductors in a row can have undesirable conductor-to-conductor variation in a testing interface as the distance from the center of the signal conductors to the divider elements may vary along the row of signal conductors. In one embodiment of the present invention openings of various shapes and sizes are formed in the conductive layer of the divider elements to correspond to the location of the signal conductors, adjusting the characteristic impedance. By sizing the openings corresponding to each signal conductor along a row of signal conductors to provide the same characteristic impedance, characteristic impedance matching is achieved.

Another embodiment of the present invention is directed to test divider devices and a method for using the test dividers to experimentally determine the sizes for openings that will provide characteristic impedance matching. Test dividers are provided that are fabricated from the same material as the divider sections with the same conductive layer thereon. Openings of the desired shape are formed in the conductive layer at various sizes. A pair of mirror-image test dividers is then inserted on either side of a row of signal conductors with openings aligned to a particular signal conductor and characteristic impedance measurements are taken. The procedure is repeated for each of the variously sized openings, then the entire procedure is repeated for another specific signal conductor. The opening size is interpolated for each signal conductor that will provide the desired characteristic impedance. Openings are then formed in a divider element having the sizes determined for the corresponding signal conductors.

Figure 1:
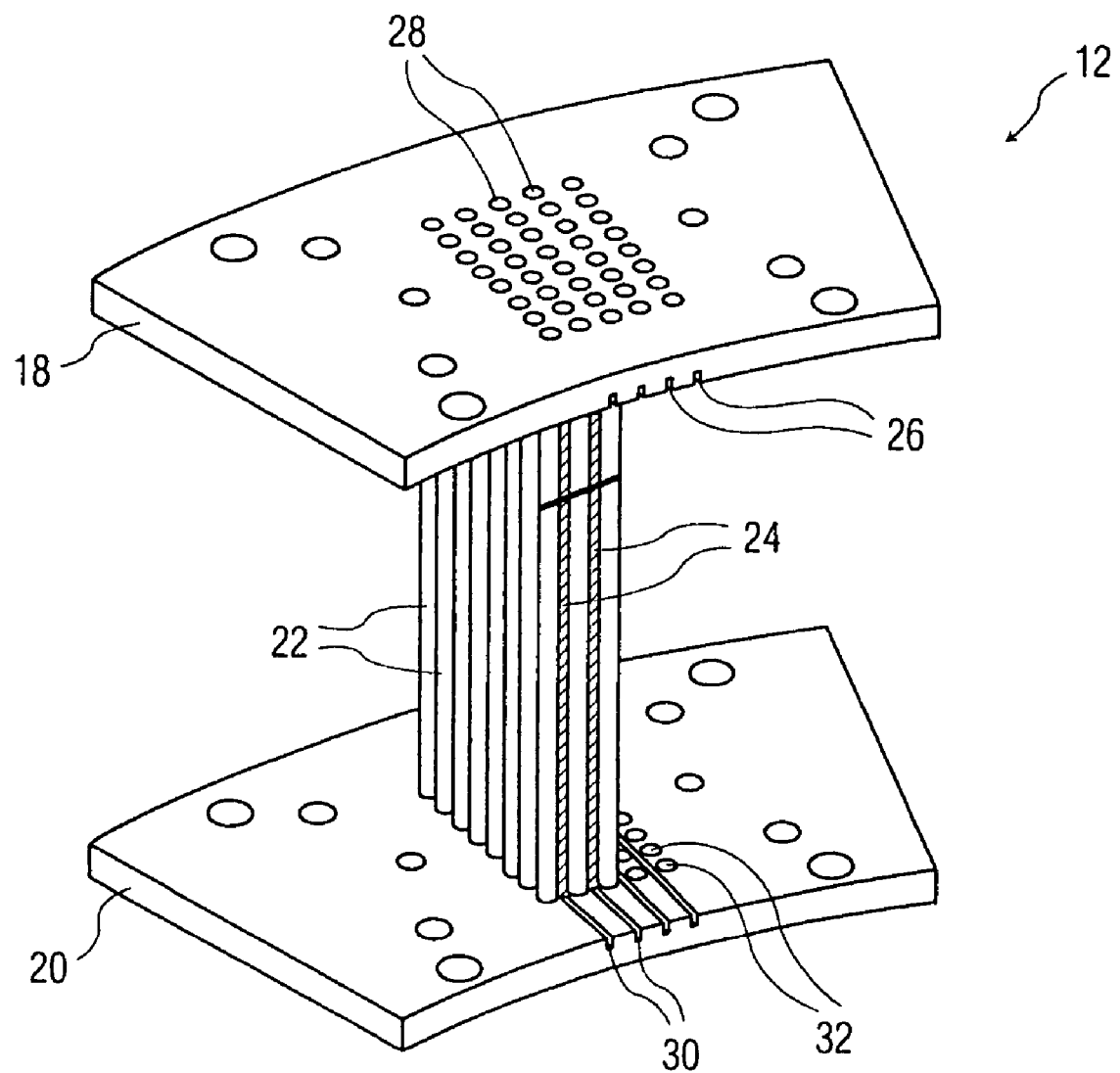
FIG. 1 is a perspective diagram of a section of an interface apparatus for an IC testing tool according to one embodiment of the present invention.

FIG. 1 shows a section of an interface apparatus 12 for coupling a test head and a probe card during testing of an integrated circuit on a semiconductor wafer. It should be understood that the invention is not limited to a wafer testing apparatus, but can also be practiced in a packaged part testing embodiment. Interface apparatus 12 can be directly coupled between the test head and probe card. Alternatively, the test head and/or probe card may be equipped with intermediate coupling structures that interface with interface apparatus 12. As shown in FIG. 1, interface apparatus 12 includes a first plate 18, a second plate 20, conduits 22, and dividing elements 24. First plate 18 is disposed adjacent the test head (not shown), whereas second plate 20 is disposed adjacent the probe card (not shown). Conduits 22 and dividing elements 24 extend between first and second plates 18,20. Conduits 22 are generally elongated and tubular and may be, for example, circular or rectangular in cross-section. Each conduit 22 contains a spring-loaded conducting element (not shown), such as the type commonly referred to as a pogo pin. As an alternative, conduits 22 could accommodate a pin-and-socket connector as the conducting element. The conducting element electrically couples a contact associated with the test head to a corresponding contact associated with the probe card. The contacts associated with the test head and probe card may comprise pins. The combination of conduits 22 and conducting elements will for simplicity be referred to hereinafter as conductors.

First plate 18 includes first grooves 26, to receive the top edges of divider elements 24, and first sockets 28, to receive the top of conduits 22. Similarly, second plate 20 includes second grooves 30 and second sockets 32. In the case of FIG. 1, first and second plates 18,20 are annular forming a section of a ringlike structure. However, other configurations are possible as will be further discussed later. Sockets 28,32 are arranged in radial rows and grooves 26,30 are oriented along radii between the rows of sockets. Conductors 23 and divider elements 24 are similarly arranged in a radial pattern as shown in FIG. 2 with the center of the radii beyond the boundary of the interface apparatus.

Figure 2:
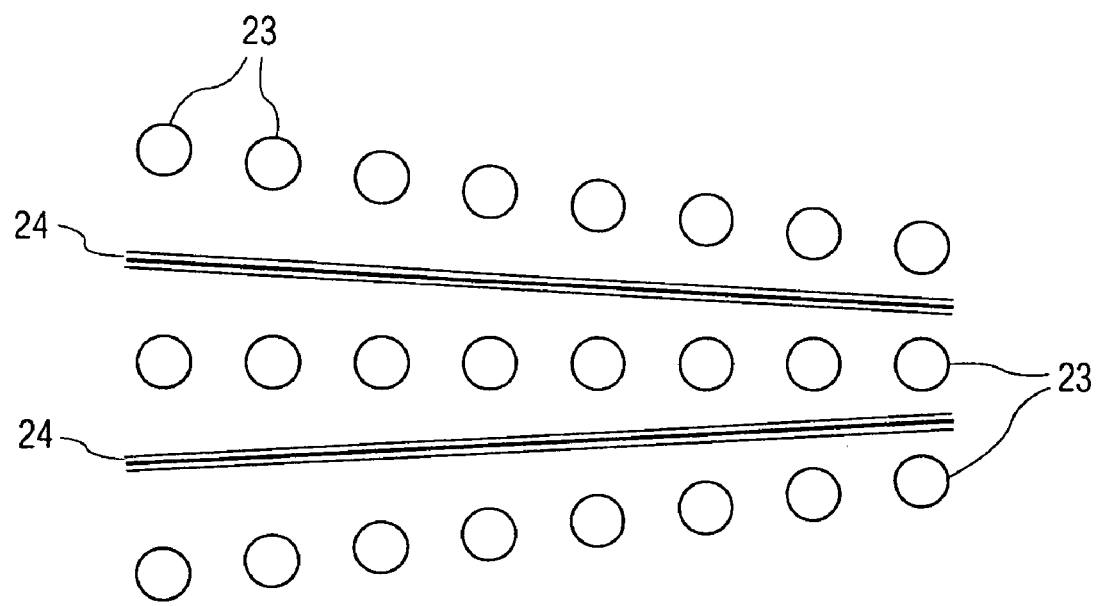
FIG. 2 is sectional view of an interface apparatus according to one embodiment of the present invention taken generally normal to the conductors, or pogo pins.

As is shown in FIG. 2, the distance from the center of the conductors to the adjacent divider elements is greater proceeding further along the radius (to the left in FIG. 2). FIG. 2 illustrates a cross section of conductors 23 that are perpendicular to and between upper and lower plates (not shown). Three radial rows of conductors 23 are shown, each radial row being separated from an adjacent row by a divider 24. In one typical arrangement, conductors 23 along a given row may be arranged in a signal-ground-signal-ground arrangement so as to minimize cross talk between signals. In such an arrangement it may be preferable to have an odd number of conductors in each row, with the end conductors assigned to ground.

The conductors 23 carry signals and grounds from one plate to the other plate. The divider elements 24 disposed between rows of conductors may include one or more conductive layers to provide shielding for signal transmission in the conductors 23. The conductive layers of the divider elements 24 are typically connected to ground potential and serve to provide shielding between the signal conductors in one row on one side of the divider and the signal conductors in the row on the other side of the divider.

The function of each conductor 23 and the geometric arrangement of the conductors 23 are two important aspects of the design of the interface that may be determined by the design of the test head or, if present, the aforementioned intermediate coupling structure associated with the test head.

Thus, the test head or its associated coupling structure may determine which conductors 23 carry signals and which carry grounds. (It is noted that in addition to signals and grounds, certain specific conductors will typically be assigned to carry power or special test control signals. Generally, these are much fewer and separate from the signal and ground conductors 23 under consideration in the present invention.).

Geometric arrangements of conductors 23 include radial arrangements and rectangular arrangements. In radial arrangements the conductors 23 are located along rows that are radii of a set of concentric circles; thus, the rows are not parallel. Typically, the device under test (dut) is located at the approximate common center of the concentric circles. It is also typical that each conductor 23 will be located at the intersection of one of the rows and one of the concentric circles, thus forming a radial grid.

Rectangular arrangements are those where the conductors 23 are located along rows that are parallel to one another. It is typical that the conductors 23 will be located along the rows so as to form a rectangular grid.

In a segmented interface, the interface is comprised of a number of segments disposed about the dut, where each segment includes a cluster of conductors 23. The conductors 23 within a cluster may be arranged in a radial fashion or a rectangular fashion. The distance between segments is often several times the distance between rows within a cluster.

In a grid type of geometric arrangement (either radial or rectangular) a conductor 23 has nearest neighbor conductors 23. For convenience, consider the direction along a row to be North-South. The nearest neighbors to a conductor are then the closest conductors within the grid in the North and South directions in it row and in the East and West directions in the adjacent rows. A conductor that is located in a row which has a row on either side of it and which is not at the end of its row has four nearest neighbors; one North, one South, one East, and one West. A conductor located at the end of a row has three nearest neighbors; a conductor located in a row at the edge of the grid also has three nearest neighbors; and a conductor located at the corner of the grid has only two nearest neighbors.

The physical arrangement of signal and ground functions of the conductors (23) is typically determined by the design of the test head. Two possible arrangements in a grid type (either radial or rectangular) of geometric arrangement are checkerboard and striped. (Numerous other arrangements are also possible; however, these two are sufficient for the present discussion.) In a checkerboard arrangement, the nearest neighbors of a signal conductor are ground conductors, and the nearest neighbors of ground conductors are signal conductors. For example, along one row the conductors may be arranged signal, ground, signal, ground, etc., and along the two adjacent rows the conductors would be arranged ground, signal, ground, signal, etc. In a striped arrangement the pattern of signal and ground conductors is the same along adjacent rows. Thus the East and West nearest neighbors of a signal conductor are signal conductors while its North and South nearest neighbors are ground conductors. Similarly, the East and West nearest neighbors of a ground conductor are ground conductors while its North and South nearest neighbors are signal conductors. Thus, the designer of an interface is typically not free to determine the arrangement of the conductors. We now consider the present invention viewed in the commonly used radial arrangement; the results may readily be applied to other arrangements including rectangular by one of ordinary skill. In a radial arrangement, the row-to-row spacing between the conductors increases with increasing distance from the center of the radius on which the conductors are positioned. Accordingly, with all other factors and dimensions held constant, the characteristic impedance will increase along a row of conductors with increasing distance from the center of the interface (located beyond the boundary of the interface apparatus). Thus it is important to have a means to design and construct an interface that provides controlled characteristic impedance for all critical signals of interest.

In an interface having a row of conductors where all signal conductors should have close to the same nominal characteristic impedance, it would be typical for the designer to set the physical parameters of a signal pin "cell" at the desired nominal characteristic impedance at a point midway between the two ends of the row and then estimate the characteristic impedance at each end. In certain cases the non-linearity in the variation of the characteristic impedance along the row may be significantly pronounced, and in such cases the designer can adjust the point at which the nominal characteristic impedance occurs in order to minimize the end-to-end variation. Also, the designer could specify varying conductor sizes along the row to further adjust individual characteristic impedance values and to minimize the overall variation.

Along an electrical signal transmission path structure that is uniformly constructed along its length, the characteristic impedance may be analyzed by considering the geometry of a cross section of the structure. The structure includes a forward conductive path from signal source to signal sink and a parallel return conductive path. In practice, the return path is typically tied to ground potential. The cross section is taken at right angles to the path, and the path is uniform so long as the cross section is the same at every point along the path. Provided that the materials involved are not ferromagnetic, the signal path is virtually lossless, and insulating materials involved have a uniform permittivity, which is the case in virtually all applications of interest, the characteristic impedance of the line is given by $$Z=[\sqrt{\in_R}]/[v\ C]\text{Ohms} \quad \text{(Eq. 1)}$$

Where $\in_R$=the relative permittivity=1 in air or vacuum
v=speed of light, approximately $3 \times 10^8$ meters/sec.
C=Capacitance of the line in farads/meter The capacitance of the line is the capacitance between the two parallel conductors. Generally, capacitance between two conductive bodies is proportional to the relative permittivity $\in_R$ of the material between the conductors. Generally, capacitance increases with increasing surface area of the conductors facing one another, and decreases with increasing distance between the conductors. In a cross sectional representation, surface areas of the conductors are proportional to their perimeters. In virtually all analysis, it is assumed that the conductivity of the conductors is infinite which is consistent with the virtually lossless assumption. The characteristic impedance can be adjusted or designed in by controlling the distance between conductors and by varying the exposed surface areas and shapes. That is, increasing the spacing will decrease Z, while decreasing the effective surface area will increase Z.

Numerous approaches have been followed over the years to determine Z of a uniform transmission line given its cross sectional structure. In general the procedure is to mathematically apply a potential difference across the two conductors and solve Laplace's equation, $\nabla^2 \phi=0$, to find the two dimensional electric field. From knowledge of the field, the charge on the conductors is determined, and then the capacitance may be found. The literature is rich in approaches to methods of solution. Solutions may be handled using a variety of methods, including:

1. direct analysis for simple geometries,
2. constructing physical models and performing actual physical measurements of the field as disclosed in Shadowitz, *The Electromagnetic Field*, p. 359–360, Dover Publications, Inc., 1988, incorporated herein by reference,
3. graphical approximations as disclosed in Stewart, *Circuit Analysis of Transmission Lines*, p. 59–60, John Wiley & Sons, Inc., 1958, incorporated herein by reference,
4. mathematical conformal transformation of the actual geometry to a geometry having a known solution, or
5. numerical techniques, including iterative solutions to finite difference equations which approximate Laplace's equation.

Direct analysis techniques include superposition approaches where applicable and the use of image techniques for the substitution of a known geometry into the given geometry. In addition, various handbooks are available that provide formulae for various geometries of interest. The application of formal techniques to even simple geometries, however, requires considerable specialized skills. In the practical world, where geometries can be complex, a combination of experience-based approximation and focused experimentation is typically required to engineer a solution. This process may be supported to varying degrees by computer modeling and simulation, for example by difference equation techniques, if desired. Herein, an experimental approach to the practice of the present invention is described.

In the apparatus shown in FIGS. 1 and 2, the characteristic impedance of a conductor 23 will be affected by the conductive divider elements 24 that are adjacent to it as well as the two conductors that are located on either side of it in its row. In a high performance interface apparatus, it is usually preferred to alternate signal and ground connections along a row of conductors. The conductors immediately adjacent to a given signal-carrying conductor are normally ground carrying conductors. That is, the signal conductor provides the signal path from source to sink, and the combination of the divider elements and the two adjacent ground conductors provide the return path.

Preferably, a single row will contain an odd number (2N+1) of conductors. Numbering the conductors from 1 to 2N+1 from one end of the row to the other, the odd-numbered conductors carry ground, and the even-numbered conductors carry signals. Thus, in typical application, a signal conductor is surrounded on four sides by ground conductors. The apparatus configuration shown in FIG. 3a, comprising a signal conductor 23s, two ground conductors 23g, and sections of two conductively coated divider elements 24, will be referred to as a "cell." The divider elements 24 may be coupled to ground potential. The signal conductor 23s and ground conductors 23g each have a diameter of d. The center-to-center spacing between the signal conductor and each adjacent ground conductor is S. The distance between the center of the signal conductor 23s and each divider element 24 is W/2. A first order approximation to the characteristic impedance of this cell can be made be comparing it to similar transmission line configurations having known expressions for their characteristic impedance. The well-known handbook, *Reference Data for Radio Engineers*, fourth edition, International Telephone and Telegraph Corporation, eighth printing September 1962, incorporated herein by reference, provides approximate formulae for numerous transmission line configurations.

Figure 3A:
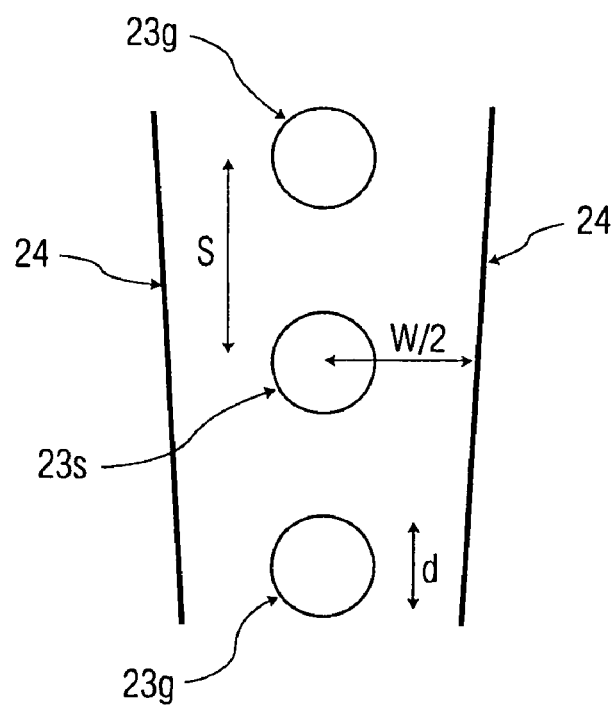
FIG. 3a is a diagram of a conductor cell with grounded divider elements for characteristic impedance analysis according to one embodiment of the invention.
Figure 3B:
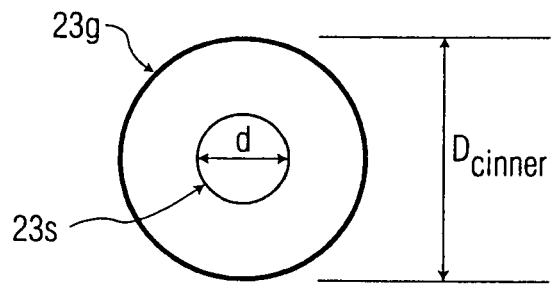
FIG. 3b is a diagram of a coaxial transmission line cell, which is a known impedance cell for analysis by comparison.
Figure 3C:
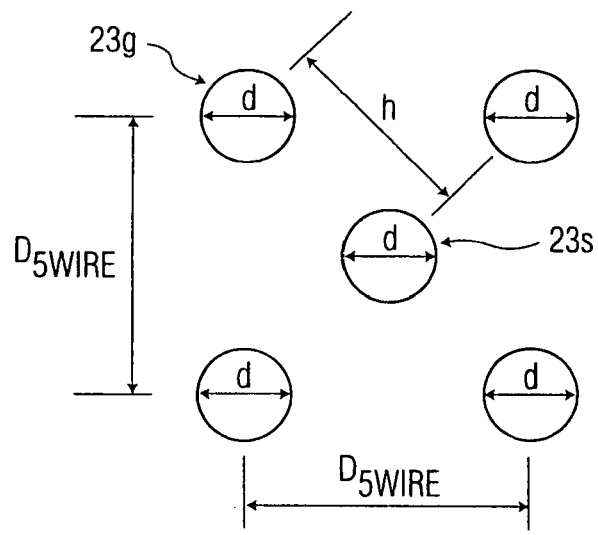
FIG. 3c is a diagram of a five wire line cell, which is a known impedance cell for analysis by comparison.

Two configurations, found in the handbook, that bear similarities to the present situation are illustrated in FIGS. 3b and 3c. FIG. 3b illustrates the familiar case of coaxial cylinders having characteristic impedance:

$$Z_{COAX} = (138/\sqrt{\in_R}) \text{Log}_{10}(D_{COAX}/d) \qquad \text{(Eq. 2)}$$

where $\in_R$ is the dielectric constant or relative permeability and is equal to 1.0 in air, D is the diameter of the coax ground 25g, and d is the diameter of the signal conductor 23s. FIG. 3c is referred to in the handbook as a "Five-wire Line," having approximate characteristic impedance given by:

$$Z_{5WIRE} = (173/\sqrt{\in_R}) \text{Log}_{10}(D_{5WIRE}/0.933d) \qquad \text{(Eq. 3)}$$

Or, $$Z_{5WIRE} = (173/\sqrt{\in_R}) \text{Log}_{10}(\sqrt{2}h/0.933d) \qquad \text{(Eq. 4)}$$

where h is the distance from a signal conductor 23s to each of four surrounding ground conductors 23g.

It is interesting that for similar dimensions (i.e., h=D/2 and $D_{COAX} = D_{5WIRE}$) that the coaxial cable and the five-wire line configuration provide similar results. For example, with representative dimensions corresponding to an interface of the type in question would be d=50 mils, and $D_{COAX}$=2h=200 mils. These values yield $Z_{COAX}$=83.0 ohms and $Z_{5WIRE}$=83.3 ohms with an air dielectric ($\in_R$=1). For cases where $D_{COAX}$=2h, the two configurations give similar results within approximately +/−6.5% for values of 2h/d between 3 and 6.5. This suggests that similar formulae can be adapted to different geometric arrangements.

Accordingly, either of the configurations in FIGS. 3b and 3c can be adapted to estimate an approximate value of the characteristic impedance of the configuration of interest in FIG. 3a. Herein, only the adaptation of FIG. 3b is discussed; a similar procedure may be followed with respect to FIG. 3c. To adapt FIG. 3b, $D_{EQUIV}$, an equivalent effective average distance from the center of the signal conductor to the ground carrying components, is determined and used in place of $D_{COAX}$. In practice the aspect ratio of a cell is not one as it is in FIGS. 3b and 3c. For example, the conductor-to-conductor spacing, S in FIG. 3a, may be a factor of two or more greater, than the distance from the center of the conductor to the conductive surface of the divider. However, from actual measurement data of cells having an approximate aspect ratio of two, a reasonable approximation is obtained by calculating:

$$D_{EQUIV} = (2S - 0.9d + W)/2 \qquad \text{(Eq 5)}$$

Then the characteristic impedance of the cell is approximated by $$Z_{CELL} \approx 138\sqrt{\in_R} \text{Log}_{10}(D_{EQUIV}/d) \qquad \text{(Eq 6)}$$

Where: $\in_R$ is the dielectric constant or relative permittivity (=1 in air), S is the center to center spacing of the conductors in the cell, d is the diameter of the conductors, and W is the distance from the conductive surface of one divider element to the conductive surface of the other divider element at the location of the signal conductor.

For example, the cell containing signal conductor 23s2 in FIG. 6 (to be considered in more detail later) has the following parameters: $\in_R$=1, S=0.100, d=0.065, and W=0.109. This yields $Z_{CELL}$=38.1 Ohms, which compares favorably with the measured value of 39.4 ohms, the difference being less than 5%.

As can be seen in FIG. 2, the spacing between the divider elements, W, increases with increasing distance from the center of the radii on which the rows of conductors lie. If the outermost signal pin is X times farther from the center than the innermost signal pin, then the value of W is X times greater at the outer circumference then at the inner circumference. Accordingly, with all other dimensions held constant, the characteristic impedance will increase along a row with increasing distance from the center of the interface. $D_{EQUIV}$ may be rewritten as a function of the radial distance from the center as follows:

$$D_{EQUIV} = (2S - 0.9d + (W_i)^*(R/R_i))/2 \qquad \text{(Eq. 7)}$$

Where:

$R_i$=distance from the center to the innermost signal conductor $W_i$=distance between the divider elements at $R_i$ R=distance from the center to the conductor in question In a high frequency test interface, all signal conductors in a row should have close to the same nominal characteristic impedance. It would be typical for the designer to set the physical parameters of a signal pin "cell" at the desired nominal characteristic impedance at a point midway between the two ends of the row and then estimate the characteristic impedance at each end. In certain cases the non-linearity in the variation of the characteristic impedances along the row may be significantly pronounced, and in such cases the designer can adjust the point at which the nominal characteristic impedance occurs in order to minimize the end-to-end variation.

Figure 4:
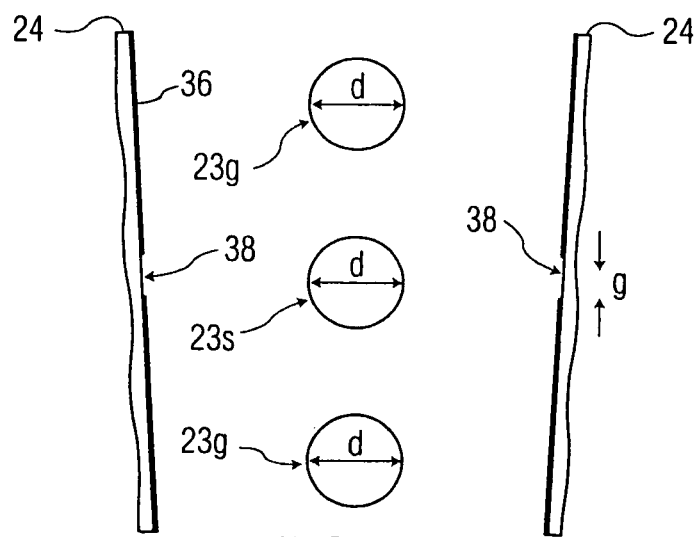
FIG. 4 is a diagram of a conductor cell with an opening or gap in the grounded divider elements according to one embodiment of the present invention.

Referring again to FIG. 3a, the conductive layers on the divider elements 24 within the proximity of a signal conductor 23s form a significant portion of the area of the effective capacitor between the signal conductor and ground potential. If the conductive area of the divider element(s) is decreased, the capacitance is decreased, and the characteristic impedance will be increased. The conductive layers of the divider elements may be fashioned from circuit board stock having a conductive layer, typically copper, clad to an insulating substrate. The conductive area can be reduced by the process of etching away portions of the conductive layer according to a predetermined pattern. This may be achieved by the normal process of producing a patterned conductive layer on a printed circuit board. FIG. 4 shows a sectional view of a cell that has been tuned (i.e., the characteristic impedance has been adjusted) by removing a portion of the conductive layer on the divider element. A vertical (perpendicular to the page) strip of width g has been removed from the conductive layer 36 of both divider elements 24 at the location of the signal conductor to form an opening 38. Although only one vertical strip per divider is indicated in FIG. 4, it is possible to remove a plurality of vertical strips within a cell if it is so desired.

Figure 5A:
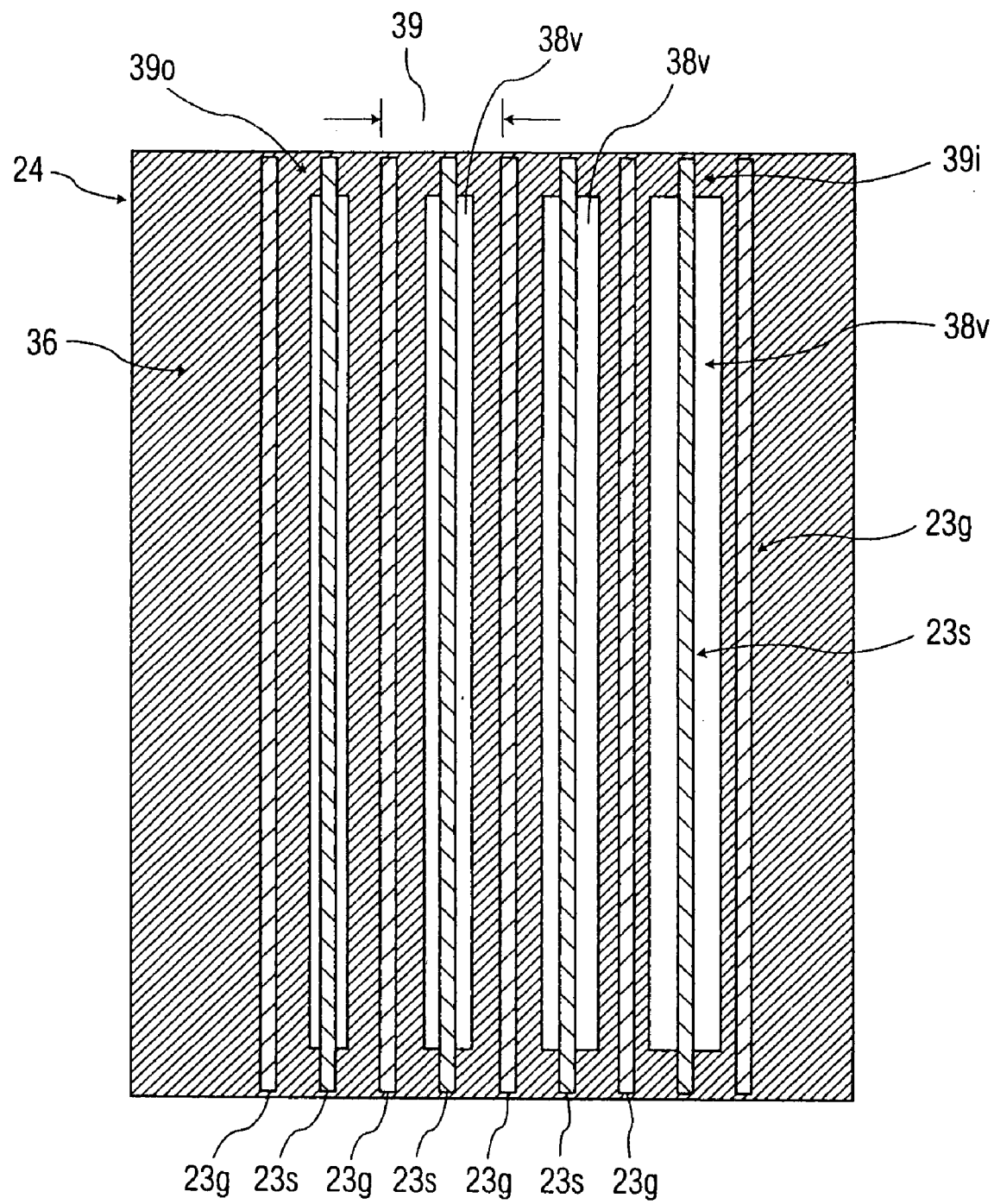
FIG. 5a is a sectional diagram taken generally parallel to a row of conductors and showing an elevation of the row of conductors and a divider element with a patterned conductive layer according to one embodiment of the present invention.

FIG. 5a is a sectional view of an interface apparatus showing an elevation of a row of four cells 39 within the interface. It shows the five ground conductors 23g and four signal conductors 23s. A divider element 24 is shown behind the conductors 23. The divider element is coated with a conductive layer 36. A vertical strip of the conductive layer is removed at each signal conductor position forming vertical openings 38v. It is seen that the vertical openings 38v do not go all the way to the top and bottom of the divider element. This is to provide conductive material to connect all conductive regions of the divider element to provide ground continuity. Also, the conductive area along the top and bottom of the divider element makes contact with the ground connection provided in the top and/or bottom plates 18,20 of the interface by way of the grooves 26,30. It is seen in FIG. 5a that the vertical openings 38v in the conductive layer 36 become increasingly wider in moving from the outermost cell 39o to the innermost cell 39i. This illustrates the concept where an increasing amount of material is removed with decreasing distance from the center of the radius on which the conductors are located. This has the desired effect of offsetting the effects that cause the characteristic impedance to decrease with decreasing distance to the center of the interface in order to maintain nearly constant characteristic impedance along the entire row of signal conductors.

Figure 5B:
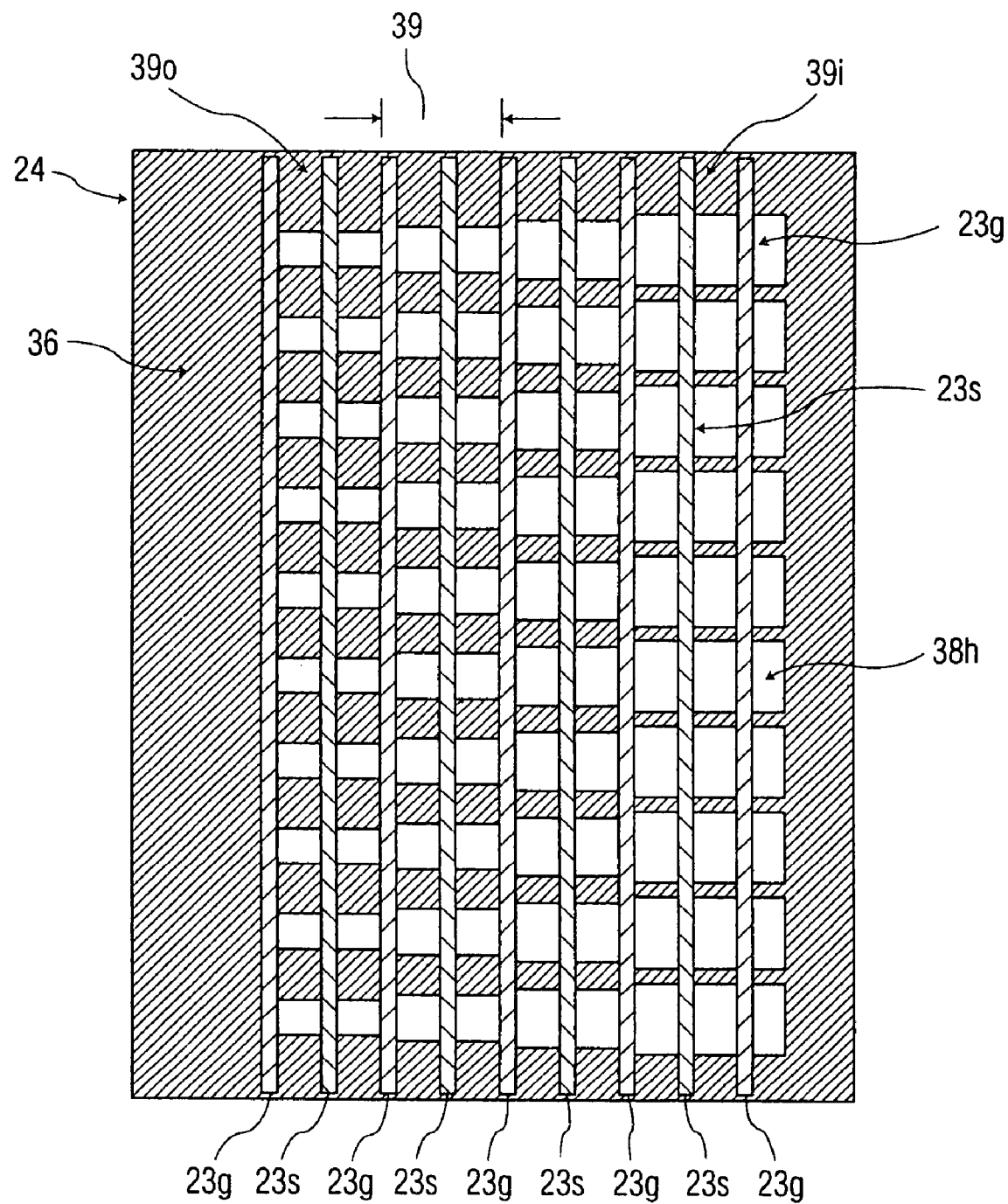
FIG. 5b is a sectional diagram taken generally parallel to a row of conductors and showing an elevation of the row of conductors and a divider element with a patterned conductive layer according to one embodiment of the present invention.

FIG. 5b is also a sectional view of an interface apparatus showing an elevation of a row of four cells 39 comprising the five ground conductors 23g and four signal conductors 23s. A divider element 24 is shown behind the conductors 23 with conductive layer 36 on the divider element. A plurality of horizontal strips of the conductive layer 36 are removed through each cell 39 to form horizontal openings 38h. It is observed that the dimension of the horizontal openings that is parallel to the conductors becomes larger moving from the outermost cell 39o to the innermost cell 39i. This exemplifies the concept of removing an increasing amount of material with decreasing interface radius (along which the conductors are located) in order to offset the effect that causes the characteristic impedance to decrease with decreasing distance to the center of the interface.

Patterns with slots that are parallel to one another and to the signal conductors result in the transmission lines whose impedance is constant along the length of the signal conductor. Such patterns, referred to as vertical patterns, may be analyzed using a two dimensional cross section(FIG. 4), which shows that the conductive area is reduced by gaps in the ground conductor of the divider element. Exact analysis of FIG. 4, even with just one such gap per divider element, is very difficult because the ground conductor structure is comprised of several elements. With more gaps, the problem becomes even more difficult. Experimental techniques described below provide a practical means of solution.

Horizontal patterns and vertical patterns may be combined to produce crosshatched patterns (no illustration). As in the case of the horizontal patterns of FIG. 5b, the transmission line impedance varies with length: the impedance of each length segment is determined by the pattern of its cell. Once the characteristic impedance of each cell type is found, methods well known in the art may be applied to determine the electrical characteristic of the overall length. This is done by modeling it as a series of lines of varying length and impedance, to which standard transmission-matrix analysis may be applied. In practice, the total length is typically between one and three inches. At low frequencies, e.g., less than 1 GHz, the wavelength of a signal in air is greater than 11 inches, and the length of a segment is very much less than a wavelength. This has the effect of "smoothing" the segment discontinuities, so that the value of the interface impedance may be adjusted by varying the segment impedances without incurring serious overall mismatch. At high frequencies, however, this approach produces undesirable mismatch, in which case vertical patterns (wherein the impedance does not vary with length) are preferred. All of the patterns, vertical horizontal, and mixed, have a lower limit to the size of opening that may be employed. When either the width or length of the opening in a ground pattern is made too small, the opening appears closed as a result of fringing of the electric field. An opening may be deemed too small to be effective when its length or width is less than about half the shortest distance to the signal conductor (see FIG. 4, for example). Therefore, fine grids or comb-like patterns of ground conductors are effectively equivalent to solid planes.

The amount by which the capacitance of a given cell is to be reduced to achieve a desired increase in characteristic impedance may be determined as follows:

1. The characteristic impedance, $Z_{OR}$, of the cell without any conductive material removed is first determined, either by estimate or by measurement.

2. The effective total capacitance per unit length, $C_{OR}$, of the cell without any conductive material removed can be calculated as $C_{OR} = \sqrt{\in_R}/vZ_{OR}$.

3. The effective total capacitance per unit length, $C_{DES}$, of the cell having the desired characteristic impedance $Z_{DES}$ can also be calculated as $C_{DES} = \sqrt{\in_R}/vZ_{OR}$.

4. Consequently, the cell capacitance per unit length is to be reduced by an amount equal to $C_{OR} - C_{DES}$ An interface of the type illustrated by the interface section in FIG. 1 is now considered as a specific case. FIG. 6 is a sectional plan view of the center row of conductors in an interface apparatus and its adjacent divider elements 24. In the exemplary embodiment shown in FIG. 6, the rows of conductors 23 are arranged radially (i.e., each is along a particular radius of a single circle), and the angle between rows is approximately 1.53 degrees. The adjacent divider elements as shown do not have patterns etched in their conductive surfaces. The overall height of the structure in this case is, for example, approximately 2½ inches and the width of the upper plate is, for example, approximately 1¾ inches.

Figure 6:
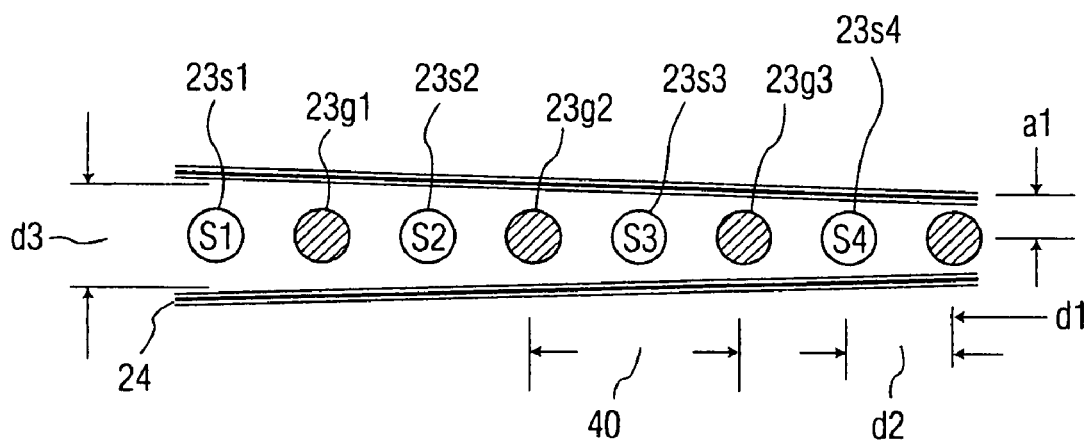
FIG. 6 is a sectional plan view of a row of conductors situated between two divider elements comprising a grounded conductive layer according to an exemplary application of the present invention.

In the exemplary embodiment shown in FIG. 6, the distance d1 from the center of the conductor row radii(not shown in FIG. 6) to the center of the innermost conductor of each row is, for example, approximately 4.046 inches. The center-to-center spacing d2 of conductors along a row is, for example, approximately 0.100 inches; and, consequently, the distance from the radius on which the conductors lie to the center of the outermost signal conductor (23$s$1) is, for example, approximately 4.746 inches. The width d3 at the center of the conduit, for example, may be approximately 0.109 inches. The divider elements 24 are arranged to lie on radii of that are midway between two rows of conductors. Accordingly, the angle al formed between a row of conductors and an adjacent divider element is, for example, approximately 0.765 degrees. The overall thickness of a divider element is approximately 17 mils to 18 mils (thousandths of one inch) in this example. A divider element can be made of copper-laminated circuit board material having a substrate made of insulating material that is covered by a conductive layer (36) of copper; the desired patterns may then be formed by etching away copper in the conventional fashion of fabricating printed circuits. In the present example, the thickness of the conductive layer is approximately 0.5 mils or less. The accuracy of etching patterns in such a thin conductive layer is reported to be as good as 0.1 mils, which is adequate for this application. The diameter of the conductors 23 used in this particular interface example is approximately 0.065 inches or 65 mils. The distance between the conductive layers 36 of the divider elements 24 at the center of the outmost signal conductor 23$s$1 is determined to be approximately 109 mils; and at the center of the innermost signal conductor 23$s$4, is approximately 93 mils.

In this particular interface the pattern of signal conductors and ground conductors is striped. In particular the innermost conductor in each row is a ground conductor 23$g$4, and the outermost conductor is a signal conductor 23$s$1. Along a row, ground conductors 23$g$1, 23$g$2, 23$g$3, 23$g$4 and signal conductors 23$s$1, 23$s$2, 23$s$3, 23$s$4 alternate as shown in FIG. 6. Accordingly, ground and signal conductors in adjacent rows are adjacent to one another.

In other known systems, signal conductors and ground conductors are in a checkerboard arrangement so that neither of two signal conductors nor two ground conductors are ever nearest neighbors of one another.

Cross talk between signal conductors is a consideration in interface design. In either a checkerboard or striped arrangement, alternating signals and ground conductors along a row minimizes cross talk between signal conductors in the same row. Divider elements 24 may be used to minimize cross talk between signal conductors in adjacent rows as disclosed in U.S. Pat. No. 6,259,260. Note that in a checkerboard arrangement without divider elements 24 cross talk between a first signal conductor in a first row and signal conductors in adjacent rows is usually low due to the presence and intervening locations of its nearest neighbor ground conductors. However, in a striped arrangement without divider elements 24 the cross talk between nearest neighbor signal conductors in adjacent rows can be severe. When an opening 38 is created in a cell's divider pattern as in FIG. 4, the nearest signal conductors of the adjacent row become exposed to radiation emitted by this opening 38. In a striped or other non-checkerboard arrangement where the nearest neighbor in the adjacent row is a signal conductor, appreciable cross talk may result due to opening 38. However, in a checkerboard arrangement the nearest neighbor ground conductor in the adjacent row blocks this vulnerability, facilitating the technique by reducing the side-effect of cross talk. The degree of shielding loss vs. control of characteristic impedance is a trade-off to be considered in a non-checkerboard design.

Another consideration is that it may be preferable to provide nearly identical cells for every signal conductor. To help achieve this rows that are at the boundary of a segment could have dividers 24 placed on both sides of it just as if it were an interior row. Also, if the test head design permits it, ground conductors should be provided at both ends of all rows.

Referring again to FIG. 6, signal conductors 23$s$2, 23$s$3, and 23$s$4 are in cell-like structures, as previously discussed. However, signal conductor 23$s$1, in the outermost position, is adjacent to only one ground conductor 23$g$1 and exposed to air on the side opposite to this ground conductor. Accordingly, the capacitance seen by signal conductor 23$s$1 is less than that seen by signal conductor 23$s$2 and we can expect that the characteristic impedance of signal conductor 23$s$1 is higher than that of signal conductor 23$s$2. Measurements made using Time Domain Reflectometry (TDR) confirm this. In particular, with divider elements in place that are fully covered with conductive material, the characteristic impedance of signal conductor 23$s$1 measured approximately 50 ohms and the characteristic impedance of signal conductor 23$s$2 measured approximately 39.4 ohms. With the divider elements removed (and with the adjacent signal conductors disconnected) the measurements were approximately 69 ohms and 60 ohms respectively. In making these measurements and the measurements to be described later, it is important that all of the neighboring ground conductors are in fact connected to ground.

Because signal conductors 23$s$3 and 23$s$4 are in environments similar to that of signal conductor 23$s$2 but with successively closer spacing between signal conductor and divider element, it is to be expected that, with divider elements installed that are fully covered with a conductive layer, the characteristic impedances of signal conductors 23$s$3 and 23$s$4 will be successively lower than that of signal conductor 23$s$2. However, in the absence of conductive divider elements, the environments of 23$s$2 and 23$s$3 are more closely identical to that of signal conductor 23$s$2 and their characteristic impedances will be more closely matched.

Determining the characteristic impedance of a signal conductor with and without a divider element that is fully covered with a conductive layer indicates the range of characteristic impedances that can be derived by patterning the conductive layer on the divider element. In the case of signal conductor 23$s$1, the available range is, for example, approximately 50 to 69 ohms. In the case of signal conductor 23$s$2, the available range is, for example, approximately 39 to 60 ohms.

Figure 7:
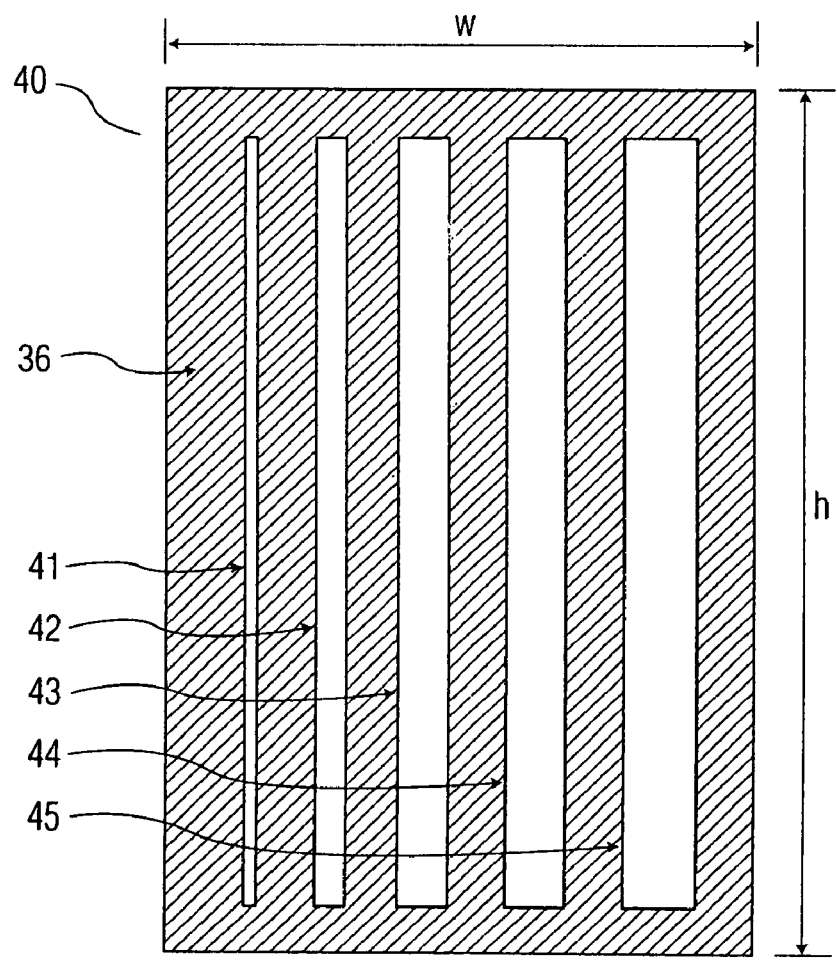
FIG. 7 is an elevation view of a test divider having a patterned conductive layer with vertical strips of varied thickness removed for experimentally tuning characteristic impedance of a given cell.
Figure 8:
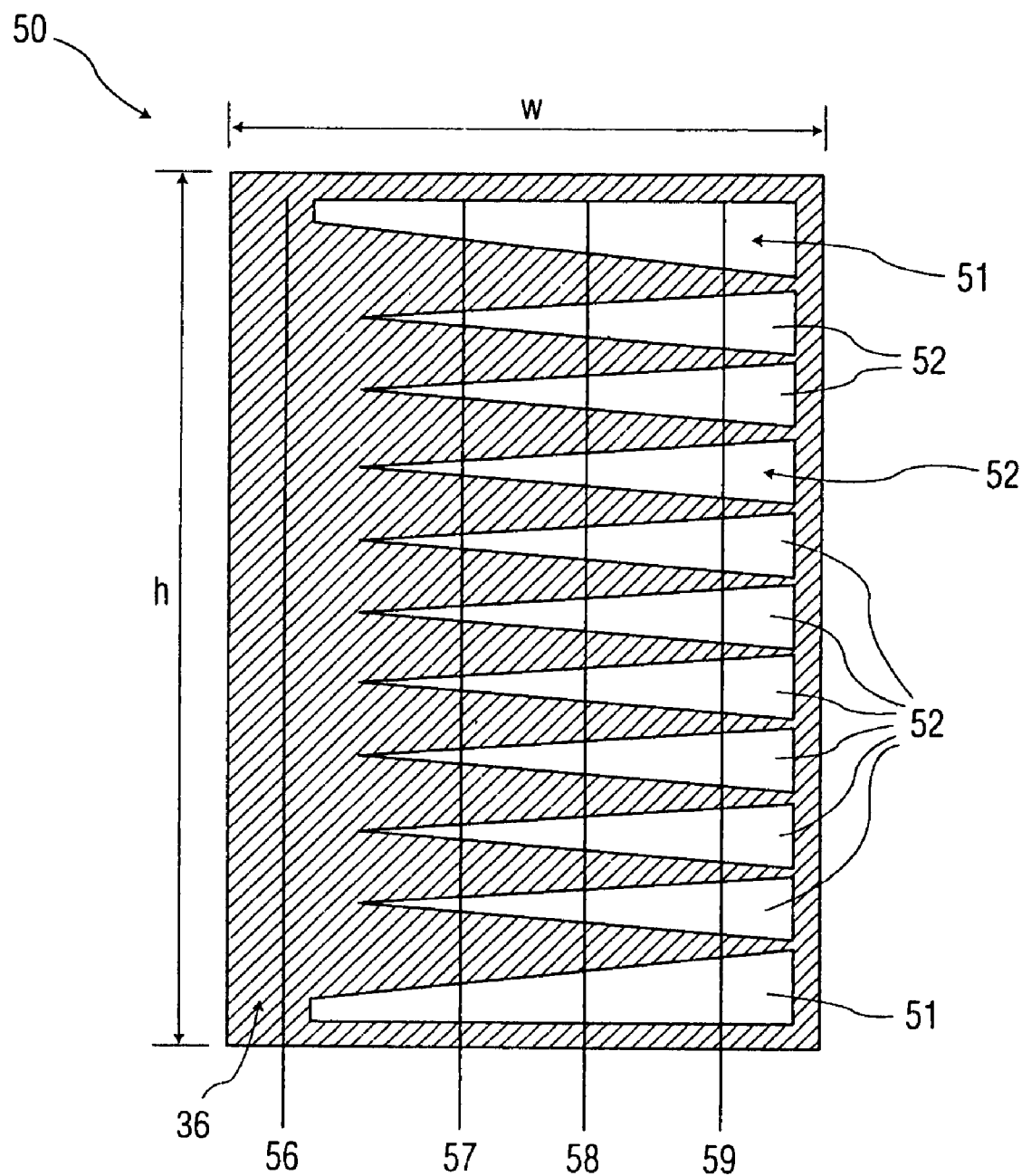
FIG. 8 is an elevation view of a test divider having a patterned conductive layer with horizontally tapered polygons removed for experimentally tuning characteristic impedance of a given cell.

FIGS. 7 and 8 show views of test dividers 40 and 50 respectively, that can be used in conjunction with TDR measurements to characterize the characteristic impedance of a signal conductor as a function of the pattern on the test dividers. These test dividers are made from the same materials as the actual divider elements, and they are made in mirror image pairs so that they may be placed on opposite sides of a signal conductor. As shown, the patterns are constructed to test the effects of a pattern on a single signal conductor at a time; that is, the horizontal spacing in the patterns does not necessarily conform to the spacing of signal conductors along a row. In use, the test dividers are inserted into the slots 26 and 30 in the first and second plates 18,20 and positioned so that a desired opening or point in tapered openings is aligned with the signal conductor to be tested. The characteristic impedance of the signal conductor is then measured by using, for example, TDR. By measuring the characteristic impedance at a number of different divider positions, data can be gathered that will allow the actual patterns for a desired interface to be designed.

The patterns in the test divider 40 in FIG. 7 are targeted, for example, for designing patterned divider elements having single vertical openings at one or more signal conductors, similar to the divider element shown in FIG. 5a. For example, in an exemplary embodiment, the width w of the divider is approximately 1.5 inches and the height h of the divider is approximately 2.25 inches. Vertical openings 41–45 are formed in a conductive layer 36 on the test divider 40. The vertical openings 41–45 have progressively greater widths that can be selected in large graduated steps. For example, in an exemplary embodiment, opening 41 is approximately 0.031 inches wide, opening 42 is approximately 0.070 inches wide, opening 43 is approximately 0.110 inches wide, opening 44 is approximately 0.150 inches wide, and opening 45 is approximately 0.180 inches wide. The vertical openings 41–45 are sequentially aligned with a particular signal conductor, and the characteristic impedance is measured. The opening width can then be interpolated for a desired characteristic impedance.

The patterns in the test divider 50 in FIG. 8 are targeted, for example, for designing patterned divider elements having horizontal spaces in the vicinity of one or more signal conductors, similar to the divider element shown in FIG. 5b. For example, in an exemplary embodiment, the width w of the divider is approximately 1.5 inches and the height h of the divider is approximately 2.25 inches. Tapered horizontal openings 51,52 are formed in a conductive layer 36 on the test divider 50. The tapered openings 51,52 are aligned to a signal conductor being tested at points with progressively more or less of the conductive layer removed and characteristic impedance measurements are taken. For example, each trapazoidal area of removed conductor 51 may have approximate dimensions of 0.06"×0.42"×1.20". For example, each triangular area of removed conductor 52 may have approximate dimensions of 0.32"×1.10". The percentage of the conductive layer to be removed at each signal conductor location can then be interpolated from the characteristic impedance measurements. For example, the elevation view of the divider 50 shown in FIG. 8 provides an indication of the percentage of the conductor layer to be removed at various locations. For example, marker line 59 represents 34% of the conductive layer, marker line 58 represents 56% of the conductive layer, marker line 57 represents 82% of the conductive layer, and marker line 56 represents 100% of the conductive layer. Other forms of test dividers can readily be developed to evaluate and characterize other styles of patterns.

To illustrate the use of the test dividers, an exemplary case is considered in which it is desired to design patterns for signal conductor 23s2 such that signal conductor 23s2 will have a characteristic impedance of 50 ohms. First, vertical patterns are designed. The pair of test dividers 40 of FIG. 7 is inserted into the interface and corresponding selected openings are aligned with signal conductor 23s2 such that, for example, a line between the centers of the corresponding openings on the two test dividers passes through the center of signal conductor 23s2. Offset alignments are possible, but in order to have minimal effect on adjacent cells in the row, especially in the case of wide spaces, the foregoing alignment is generally preferred. It should be noted that the resulting characteristic impedance will typically vary somewhat with the alignment, so care is suggested in performing this step. Once the test dividers are appropriately aligned, the characteristic impedance of signal conductor 23s2 is measured. Other opening pairs are aligned with signal conductor 23s2, and the characteristic impedance is measured in each case. In this particular example, the following results were measured using TDR.

| Width of Opening (mils) | Impedance (Ohms) |
| --- | --- |
| 31 | 40.4 |
| 110 | 51.6 |
| 150 | 55.4 |
| 180 | 56.8 |

Figure 9:
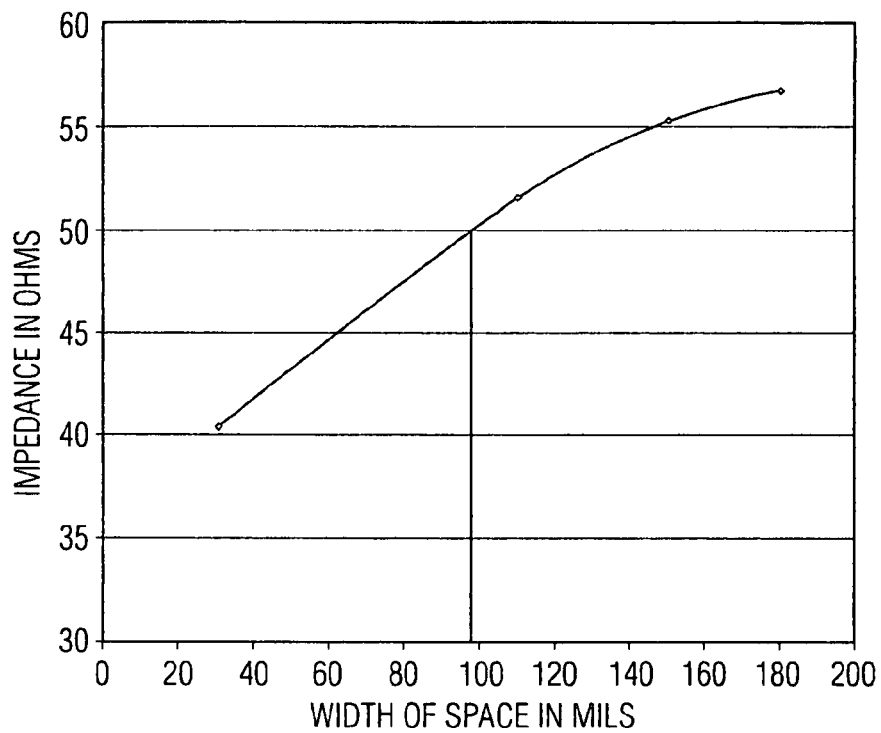
FIG. 9 is a curve showing characteristic impedance of an exemplary cell as a function of the width of an opening in the conductive layer.

These data points are plotted in FIG. 9. From this plot, it is found that the approximate width for achieving a characteristic impedance of 50 ohms is 98 mils.

Now horizontal patterns are designed. The pair of test dividers 50 of FIG. 8 is inserted into the interface. It is noted that the patterns vary continuously along the width of these test dividers. In practice, the test dividers are positioned and the characteristic impedance measured at three or four different points of insertion. At each point, care is taken to ensure that the two dividers are equally inserted so that the area of removed conductive layer exposed to the signal conductor is the same on both test dividers. Vertical lines 56–59 projected on the divider at a point corresponding to the centerline of the signal conductor 23s2 are useful in determining the fraction of conductor removed or remaining. In particular, the combined length of the line segment that coincides with the conductor divided by the total length of the line indicates the fractional area of remaining conductor. In this particular example, the following results were measured.

| Percentage of Remaining Conductor | Impedance (Ohms) |
| --- | --- |
| 34 | 52.9 |
| 56 | 49.3 |
| 82 | 46.0 |
| 100 | 39.4 |

Figure 10:
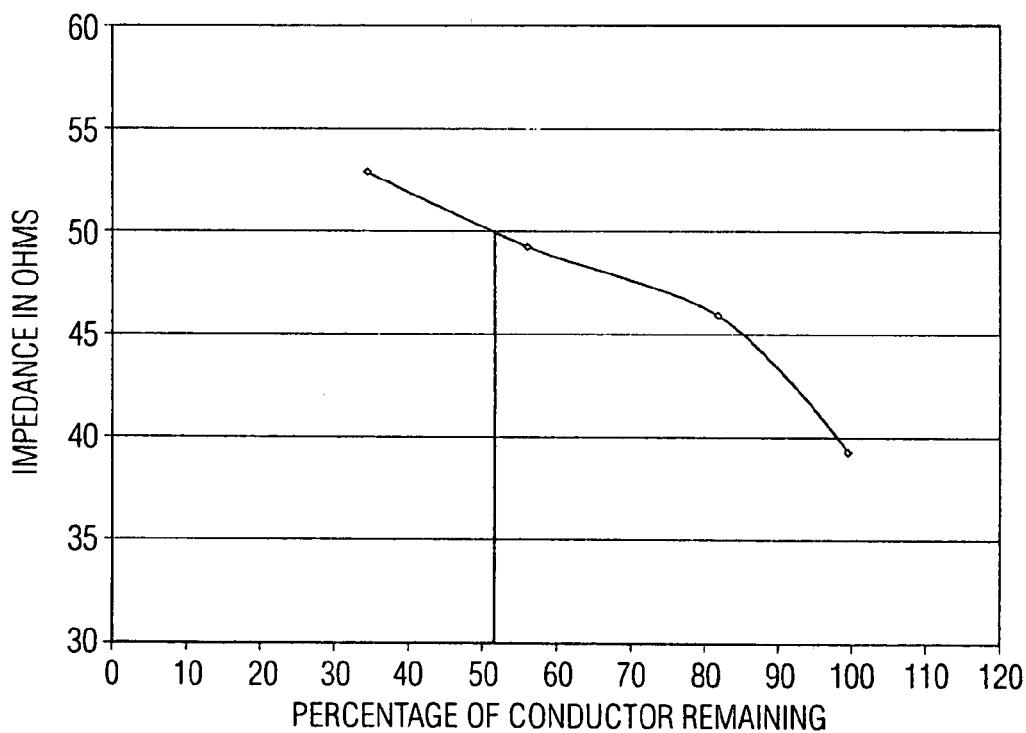
FIG. 10 is a curve showing characteristic impedance of an exemplary cell as a function of the percentage of the conductor layer remaining on the divider element in the cell.

Note that the case of 100% remaining conductor is the same as the case having a test divider entirely covered with a conductive layer as previously described. These data points are plotted in FIG. 10. From this plot, it is found that the approximate percentage of remaining conductive layer for achieving a characteristic impedance of 50 ohms is 51%.

To continue the example, vertical and horizontal patterns are now designed such that either will provide a characteristic impedance of 50 ohms for all signal conductors along a row in the interface. The procedure outlined above may be followed for signal conductors 23s3 and 23s4. It is noted that the W dimension for signal conductor 23s3 is approximately 95% of that for signal conductor 23s2, and the W dimension for signal conductor 23s4 is 95% of that for signal conductor 23s3. Consequently, the characteristic impedance for signal conductors 23s3 and 23s4 vary only slightly from each other and from that of signal conductor 23s2. It is also noted, that due to its different arrangement, signal conductor 23s1 has a substantially higher characteristic impedance than the other signal conductors in this example. In fact the characteristic impedance of signal conductor 23s1 was measured as approximately 50 ohms with a divider element fully covered with a conductive layer, which is the desired value; and, accordingly, no changes have to be made for this conductor position.

The following table lists representative values for each cell.

| Conductor | Initial Impedance (Ohms) | Width of Opening for Vertical Pattern (mils) | Percent of Conductor Remaining for Horizontal Pattern |
|---|---|---|---|
| 23s1 | 50 | 0 | 100% |
| 23s3 | 38.2 | 101 | 49.5% |
| 23s4 | 37.0 | 104 | 48% |

Figure 11:
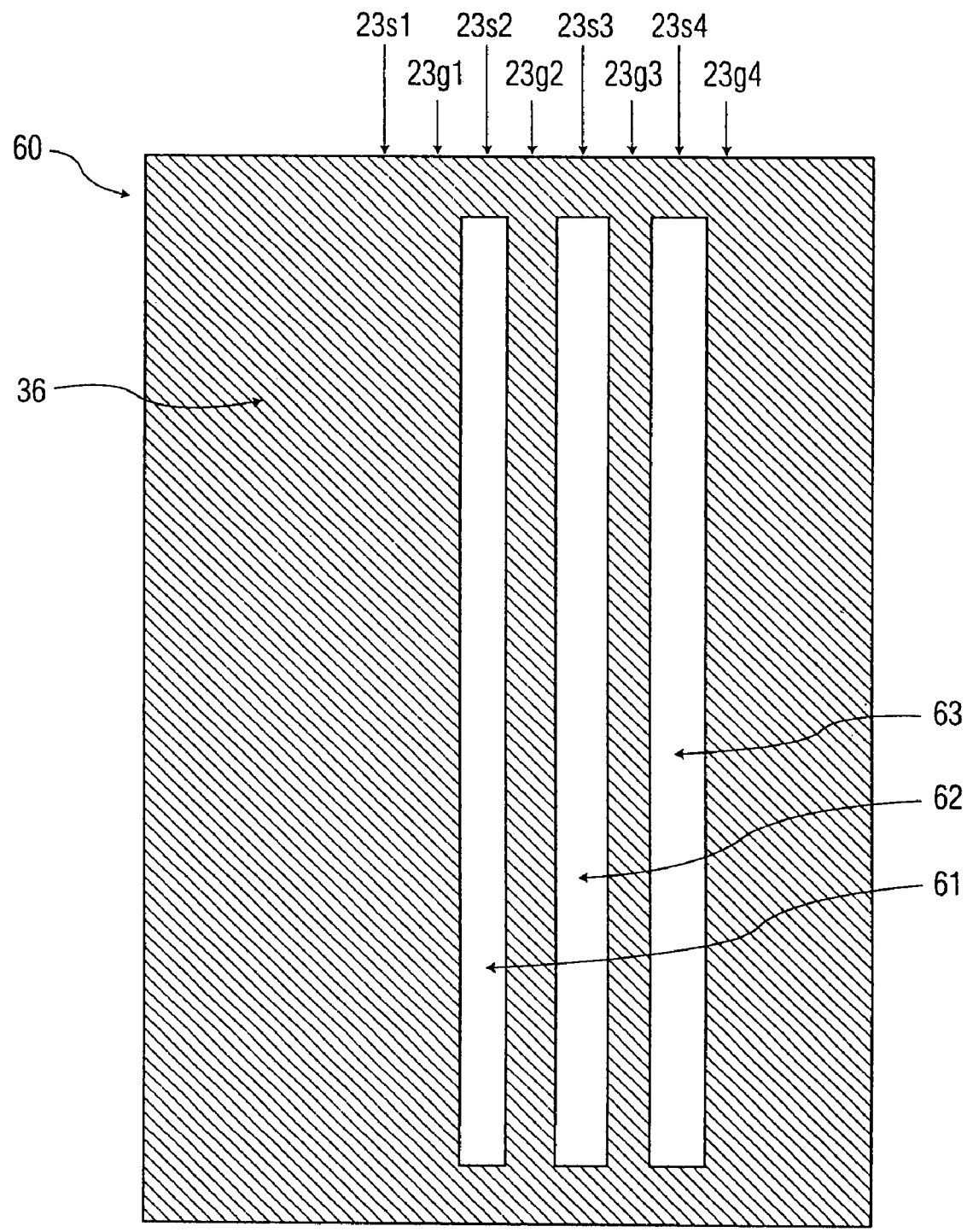
FIG. 11 is a plan view of a vertically patterned divider element for an exemplary cell.

In the cases of signal conductors 23s2, 23s3, and 23s4, it is seen that because the initial characteristic impedance varies only slightly from cell to cell; and, consequently, the required patterns vary only slightly from cell to cell. FIG. 11 shows the completed vertical pattern divider element 60, for example, for a 50 ohm impedance at all locations in the exemplary interfaces shown in FIGS. 1 and 6. For example, the divider 60 may have a width of approximately 1.5" and a height of approximately 2.25". No opening is present in the conductive layer 36 at the location corresponding to signal conductor 23s1. In FIG. 11, labels 23s1–23s4 and 23g1–23g4 mark the positions corresponding to their respective signal and ground conductors. Openings 61–63 are formed, for example, at widths of 0.098 in., 0.101 in., and 0.104 in. to correspond to signal conductors 23s2, 23s3, and 23s4 respectively in accordance with the test results.

Figure 12:
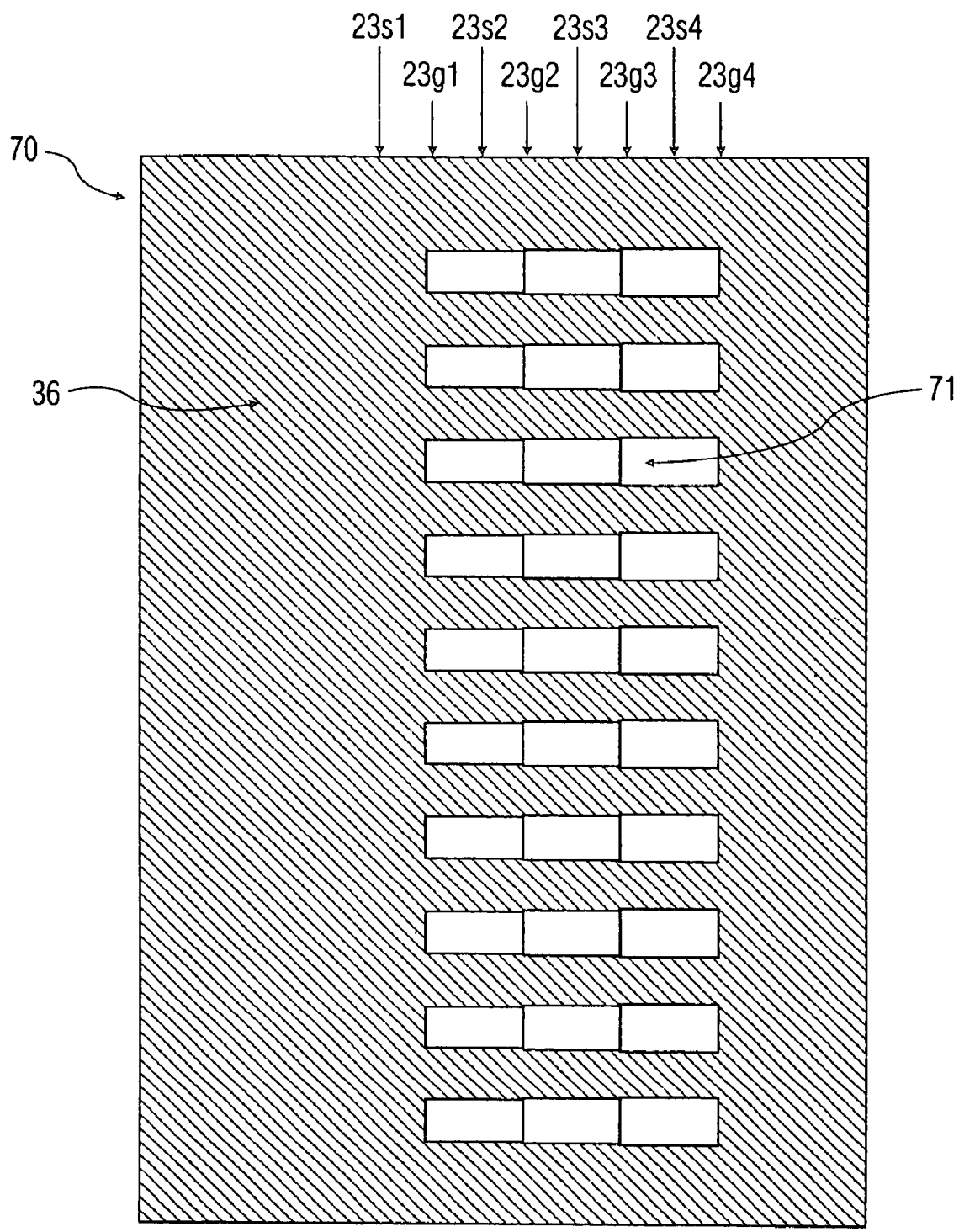
FIG. 12 is a plan view of a horizontally patterned divider element for an exemplary cell.

FIG. 12 shows the completed horizontal pattern divider element 70. Note that in FIG. 12, there are ten horizontal openings 71 in the conductive layer 36 spanning the positions corresponding to signal conductors 23s2 through 23s4 with slightly stepped sides, following the near linear results indicated in the above table. In FIG. 12, labels 23s1–23s4 and 23g1–23g4 mark the positions corresponding to their respective signal and ground conductors. Given the near linear relationships, it may be possible to perform measurements at just two similar cells and to then extrapolate the results to additional cells along a row.

The foregoing explanation has considered simple vertical and horizontal patterns. More complex patterns may also be used if desired. Once the style of a pattern has been decided upon, test dividers having a range of variations of the patterns is designed. These are then used experimentally to evaluate the patterns and to determine parameters for the patterns for the actual dividers to meet the given requirements. Also, in cases where it is desirable that the divider also provide a degree of shielding as in non-checkerboard conductor arrangements, the test dividers may additionally be used to evaluate the shielding properties of the patterns under consideration by making appropriate cross talk measurements.

Figure 13A:
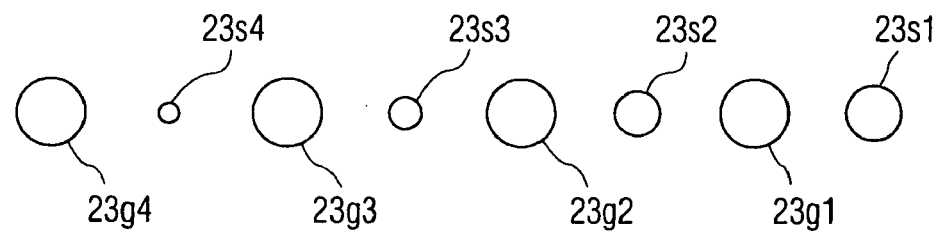
FIGS. 13a and 13b are sectional views of a row of conductors in which characteristic impedance of the conductors is tuned.
Figure 13B:
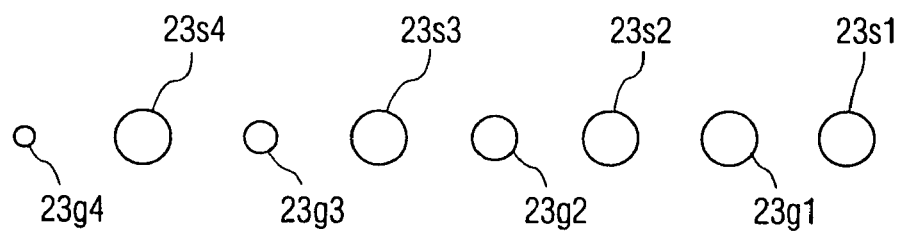
Figure 14:
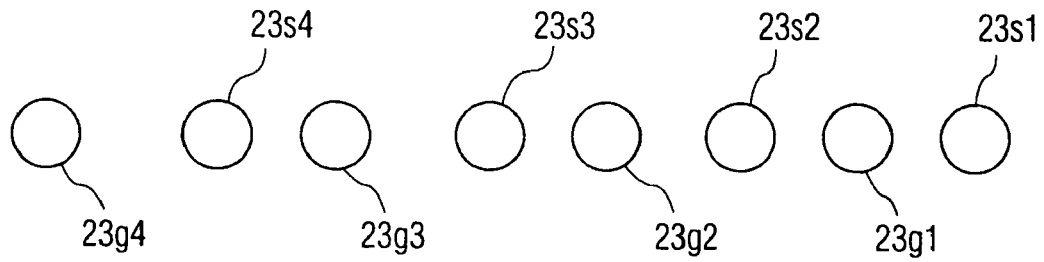
FIG. 14 is a sectional view of a row of conductors in which characteristic impedance of the conductors is tuned by altering the spacing of the conductors.

The characteristic impedance of a particular conductor in a row of conductors can alternatively be adjusted or tuned by varying the size of the conductor, the spacing between conductors, or both. FIG. 13a shows a sectional view of a row of conductors 23s1,23g1,23s2,23g2,23s3,23g3,23s4, 23g4 in which the diameter of signal conductors 23s2,23s3, 23s4 are decreased to increase their characteristic impedance. FIG. 13b shows a sectional view of a row of conductors 23s1,23g1,23s2,23g2,23s3,23g3,23s4,23g4 in which the diameter of ground conductors 23g1,23g2,23g3, 23g4 are decreased to increase the characteristic impedance in the adjacent signal conductors. FIG. 14 shows a sectional view of a row of conductors 23s1,23g1,23s2,23g2,23s3, 23g3,23s4, 23g4 in which the signal conductor-to-ground conductor spacing for signal conductors 23s2,23s3,23s4 is increased to increase their characteristic impedance.

Although the foregoing example was carried out with a radial geometric arrangement, it is obvious that the techniques apply equally well to a rectangular or other arrangements.

Although illustrated and described herein with reference to certain specific embodiments, the present invention is nevertheless not intended to be limited to the details shown. Rather, various modifications may be made in the details within the scope and range of equivalence of the claims and without departing from the spirit of the invention.

What is claimed is:

1. An interface apparatus for integrated circuit testing, the apparatus comprising:
    a first plate with a first top and a first bottom, said first plate having first locations;
    a second plate with a second top and a second bottom, said second plate having second locations;
    conductors extending between said first locations on said first plate and said second locations on said second plate; and
    a divider element having a plurality of non-conductive areas separated from each of other by a conductive area, said non-conductive areas and said conductive area in a common plane of said conductive divider element, said plane extending between said first plate and said second plate, a portion of said plane extending across ones of said conductors, said plane sandwiched between ones and other ones of said conductors.

2. An apparatus according to claim 1, wherein said conductive area comprises a metal layer and said non-conductive areas comprise openings in said metal layer.

3. An interface apparatus for integrated circuit testing according to claim 1, wherein said non-conductive areas and said conductive area form a pattern which is selected to a provide a predetermined characteristic impedance to at least one of said conductors.

4. An interface apparatus for integrated circuit testing according to claim 3, wherein said characteristic impedance varies depending upon distance between said pattern and said conductors.

5. A method of providing an interface apparatus, said method comprising the steps of:
    providing a plurality of plates including a first plate and a second plate, each of said plurality of plates having a respective top surface and a respective bottom surface;
    providing a plurality of conductors in rows and extending between said plates;

identifying a location between two rows of said conductors at which a divider element is to be situated, forming a conductive pattern on said divider element by having a plurality of non-conductive areas separated from each other by a conductive area, said non-conductive areas and said conductive area in a common plane of said divider element, and locating said divider element in said location and extending between said plurality of plates to attempt to provide an expected affect on the characteristic impedance of ones of said conductors.

6. A method of providing an interface apparatus according to claim 5, said method further comprising the steps of:

measuring how said divider element affects characteristic impedance of said ones of said conductors; and modifying said conductive pattern so that an actual affect on characteristic impedance of ones of said conductors is closer to said expected affect.

7. A method of providing an interface apparatus according to claim 5, wherein said conductive pattern is formed based upon spatial relationships between and dimensions of said ones of said conductors and said conductive pattern.

8. An interface apparatus, comprising:

a plurality of plates, each of said plurality of plates having a respective top surface and a respective bottom surface;

a plurality of conductors arranged in rows and extending between said plates;

a first conductive member having a first cross-sectional area and a second conductive member having a second cross-sectional area to provide a predetermined characteristic impedance in said plurality of conductors.

9. An interface apparatus of claim 8, wherein said predetermined characteristic impedance in first ones of said conductors and second ones of said conductors are substantially equal.

10. An interface apparatus, comprising:

a plurality of plates, each of said plurality of plates having a respective top surface and a respective bottom surface;

a plurality of signal conductors and ground conductors alternately arranged in rows and extending between said plates; wherein first ones of said ground conductors define a first plurality of shapes in a plane and second ones of said ground conductors define a second plurality of shapes in another plane, said first plurality of shapes and said second plurality of shapes formed to provide a predetermined characteristic impedance in at least one of said signal conductors adjacent said first ones of said conductors and said second ones of said conductors.

11. An interface apparatus of claim 10, wherein said predetermined characteristic impedance of said signal conductors adjacent said first ones of said conductors and said second ones of said conductors is substantially equal.

12. An interface apparatus, comprising:

a plurality of plates, each of said plurality of plates having a respective top surface and a respective bottom surface;

a plurality of signal conductors and ground conductors arranged in rows and extending between said plates; wherein the spacing between said signal conductors and said ground conductors is established to provide predetermined characteristic impedances in said signal conductors.

13. An interface apparatus according to claim 12, wherein said characteristic impedances in said signal conductors are substantially equal.

* * * * *